(12) United States Patent
Kuo et al.

(10) Patent No.: US 8,211,755 B2
(45) Date of Patent: Jul. 3, 2012

(54) METHOD FOR MULTI-LEVEL INTERCONNECTION MEMORY DEVICE

(75) Inventors: Hsiu-Lan Kuo, Taichung (TW); Kern-Huat Ang, Johor (MY)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 12/774,367

(22) Filed: May 5, 2010

(65) Prior Publication Data

US 2010/0221874 A1 Sep. 2, 2010

Related U.S. Application Data

(62) Division of application No. 11/123,376, filed on May 6, 2005, now Pat. No. 7,728,390.

(51) Int. Cl.
*H01L 21/8247* (2006.01)
*H01L 23/535* (2006.01)

(52) U.S. Cl. . 438/131; 438/622; 257/758; 257/E23.147; 257/E27.103; 257/E21.68; 257/E21.662

(58) Field of Classification Search .......... 438/131, 438/261, 622; 257/211, 324, 390, 758, E21.614, 257/E21.682, E27.026, E27.102–E27.103, 257/E27.111, E29.129, E29.302, E29.309, 257/E29.331, E23.147, E21.68, E21.662, 257/E23.145

See application file for complete search history.

(56) References Cited

U.S. PATENT DOCUMENTS

| | | | |
|---|---|---|---|
| 4,442,507 A | 4/1984 | Roesner | |
| 5,426,614 A | 6/1995 | Harward | |
| 6,034,882 A | 3/2000 | Johnson et al. | |
| 6,185,122 B1 | 2/2001 | Johnson et al. | |
| 6,490,218 B1 | 12/2002 | Vyvoda et al. | |
| 6,525,953 B1 | 2/2003 | Johnson | |
| 6,689,644 B2 | 2/2004 | Johnson | |
| 6,815,328 B2 | 11/2004 | Pio | |
| 6,881,994 B2 * | 4/2005 | Lee et al. | 257/296 |
| 6,914,007 B2 | 7/2005 | Ma et al. | |
| 6,992,349 B2 * | 1/2006 | Lee et al. | 257/324 |
| 7,247,252 B2 | 7/2007 | Pan et al. | |
| 7,319,053 B2 | 1/2008 | Subramanian et al. | |
| 7,351,992 B2 | 4/2008 | Scheuerlein | |
| 7,410,867 B2 | 8/2008 | Forbes | |

(Continued)

OTHER PUBLICATIONS

Herner et al. (Vertical p-i-n Polysilicon Diode with Antifuse for Stackable Field-Programmable ROM, IEEE Electron Device Letters, Vo. 25, No. 5, May 2004).*

(Continued)

*Primary Examiner* — Matthew C. Landau
*Assistant Examiner* — Maliheh Malek
(74) *Attorney, Agent, or Firm* — Slater & Matsil, L.L.P.

(57) ABSTRACT

A method for preventing arcing during deep via plasma etching is provided. The method comprises forming a first patterned set of parallel conductive lines over a substrate and forming a plurality of semiconductor pillars on the first patterned set of parallel conductive lines and extending therefrom, wherein a pillar comprises a first barrier layer, an antifuse layer, a diode, and a second barrier layer, wherein an electric current flows through the diode upon a breakdown of the antifuse layer. The method further comprises depositing a dielectric between the plurality of semiconductor pillars, and plasma etching a deep via recess through the dielectric and through the underlying layer after the steps of forming a plurality of semiconductor pillars and depositing a dielectric. An embodiment of the invention comprises a memory array device.

13 Claims, 8 Drawing Sheets

U.S. PATENT DOCUMENTS

| | | | |
|---|---|---|---|
| 7,422,985 B2 | 9/2008 | Dunton et al. | |
| 7,505,321 B2 | 3/2009 | Scheuerlein et al. | |
| 7,521,353 B2 | 4/2009 | Petti | |
| 7,829,875 B2* | 11/2010 | Scheuerlein | 257/2 |
| 8,008,187 B2* | 8/2011 | Dunton et al. | 438/634 |
| 2003/0136978 A1* | 7/2003 | Takaura et al. | 257/210 |
| 2004/0125629 A1* | 7/2004 | Scheuerlein et al. | 365/17 |
| 2006/0216931 A1* | 9/2006 | Petti | 438/639 |
| 2006/0216937 A1* | 9/2006 | Dunton et al. | 438/692 |
| 2007/0029607 A1 | 2/2007 | Kouznetzov | |
| 2007/0190722 A1 | 8/2007 | Herner | |
| 2008/0119027 A1 | 5/2008 | Subramanian et al. | |
| 2009/0142921 A1 | 6/2009 | Petti | |
| 2010/0184259 A1* | 7/2010 | Radigan et al. | 438/129 |
| 2011/0266691 A1* | 11/2011 | Lin et al. | 257/774 |

OTHER PUBLICATIONS

Herner, S.B., et al., "Vertical p-i-n. Polysilicon Diode with Antifuse for Stackable Field-Programmable ROM," IEEE Electron Device Letters, vol. 25, No. 5 (May 2004) pp. 271-273.

Herner, S.B., et al., "Polycrystalline Silicon/CoSi$_2$ Schottky Diode with Integrated SiO$_2$ Antifuse: A Nonvolatile Memory Cell," Applied Physics Letters, vol. 82, No. 23 (Jun. 9, 2003) pp. 4163-4165.

* cited by examiner

METHOD FOR MULTI-LEVEL INTERCONNECTION MEMORY DEVICE

This application is a divisional of patent application Ser. No. 11/123,376, entitled "Multi-Level Interconnection Memory Device" filed on May 6, 2005, which application is incorporated herein by reference.

TECHNICAL FIELD

This invention relates generally to semiconductor device manufacturing and more particularly to a method for reducing plasma arcing during anisotropic etching of dielectric layers.

BACKGROUND

As devices become smaller and integration density increases, reactive ion etching (RIE) has become a key process in anisotropic etching of semiconductor features. RIE or ion-enhanced etching works by a combination of physical and chemical mechanisms for achieving etch selectivity and anisotropy. In some applications, for example, etching high aspect ratio features such as vias, high density plasma (HDP) etching has been increasingly used in etching high aspect ratio features, for example, with aspect ratios greater than about 3:1.

During the formation of semiconductor devices it is often required that the conductive layers be interconnected through high-aspect-ratio holes in inter-metal dielectric (IMD) layers. Such holes are commonly referred to as contact holes, i.e., when the hole extends through an insulating layer to an active device area, or vias, i.e., when the hole extends through an insulating layer between two conductive layers. The profile of a hole is of particular importance since it exhibits specific electrical characteristics when the contact hole or via is filled with a conductive material. Typically, the holes are high aspect ratio holes, meaning that the ratio of length to width is greater than about 3. Such holes are typically formed by a reactive ion etching (RIE) process where complex chemical processes assisted by ion bombardment result in relatively higher etching rates in one direction versus another, known as anisotropic etching. The relative anisotropy or selectivity of the etching process will in turn determine the etching profile of an etched hole and consequently its aspect ratio. As semiconductor structures are inevitably driven to smaller sizes, successful etching of higher aspect ratio holes is becoming more difficult.

A common phenomenon in multi-level semiconductor devices is charge accumulation during plasma processing. For example, charged species may become incorporated within the surface of the layer, with localized charge accumulation aided by defects formed in the dielectric insulating layer. As dielectric insulating layers have decreased in dielectric constant, their increased electrical insulating characteristics also contribute to the localized buildup of electrical charge within the insulating portion of the multi-level device. The electrical charge build-up is frequently long lasting, lasting at least for several hours.

One detrimental effect of the localized accumulation of charge in the dielectric insulating layer is arcing. The problem of arcing or electrical discharge of the plasma to localized charged areas on the semiconductor wafer has increasingly become a critical problem in RIE processes. The arcing damage typically occurs near a metallization line, which is believed to provide a pathway to localized charged areas in the dielectric layer. The problem is critical since the damage caused by the arcing typically is typically severe and the extent of damage to underlying regions and surrounding areas not readily ascertainable making further processing of the wafer impractical. As a result, arcing damage to the wafer is costly in terms of wafer yield and reliability.

One semiconductor area where plasma arcing is a problem is in the fabrication of programmable stackable memory arrays. Shown in FIG. 1 is a conventional intermediate stackable field programmable EPROM comprising a plurality of vertical p-i-n polysilicon antifuse diodes. In a first level of memory cells, are a plurality of conventional memory cell diodes 108, the diodes having a thin $SiO_2$ or nitride antifuse layer (not shown). The memory cell diodes 108 are connected to a plurality of bitlines 111, the bitlines 111 being interposed between a TiN barrier layer 109 and a suitable underlying layer 102. The opposite end of the memory cell diodes are connected to a tungsten wordline 117, with another TiN barrier layer 118 interposed between. Conventional stacked EPROMs further include a dielectric layer 120 on the wordline 117, a first conductor 114, and a second conductor 127. On the dielectric layer 120 is a second plurality of memory cell diodes 121 having another TiN barrier layer 122 and bitlines 123, essentially the same as that of the first memory cell layer.

After forming the EPROM structure described above, a typical fabrication sequence includes depositing a forth TiN barrier layer 133. It is typically after depositing barrier layer 133 that deep via plasma etching occurs.

Turning now to FIG. 2, there is illustrated a plasma etched via 134 formed down to a suitable conductor 105 within the underlying layer 102. As shown in FIG. 2, plasma etching of via 134 involves simultaneously exposing TiN layer 136 and tungsten wordline layer 117 to the plasma. At this stage of a conventional fabrication process, TiN layer 136 and tungsten wordline layer 117 are floating conductors. Therefore, during plasma forming of via 134, a charge imbalance may occur between TiN layer 136 and wordline layer 117 thereby causing these to layers to become essentially a charged capacitor. As described above, arcing may occur. Referring to FIG. 2, arcing may occur between TiN layer 136 and an exposed corner of wordline layer 139 thereby damaging surrounding structures.

In light of these and other problems, there is a need for a method that avoids plasma arcing during plasma processing of dielectric layers.

SUMMARY OF THE INVENTION

These and other problems are generally solved or circumvented, and technical advantages are generally achieved by preferred embodiments of the present invention that provides improved structures and methods for avoiding plasma arcing during a reactive ion etching (RIE) process.

An embodiment of the invention provides a memory array. The memory array comprises a first patterned set of parallel conductive lines on an underlying layer. The underlying layer may comprise a layer of memory cells, a substrate, or a read/write transistor. Embodiments further comprise a first barrier layer on the first patterned set of parallel conductive lines, and a doped polysilicon layer on the first barrier layer. The patterned set of parallel conductive lines may comprise tungsten. Preferred embodiments further comprise an antifuse layer on the doped polysilicon layer, and a second barrier layer on the antifuse layer. Embodiments may further comprise a patterned columnar stack of layers having one end in contact with the first patterned set of parallel conductive lines, the patterned columnar stack of layers comprising the second barrier layer, the antifuse layer, the doped polysilicon layer, and the first barrier layer, and a dielectric in a recess between the patterned columnar stack of layers and through the dielectric and through the underlying layer.

In other embodiments of the invention, the memory array may further comprise an interlevel conductor in the deep via recess, and a planarized structure. Preferably, the planarized structure comprises a planarized interlevel conductor, a planarized first dielectric, and a planarized patterned columnar stack of layers. Embodiments may further comprise forming a third barrier layer on the planarized structure, forming a second patterned set of parallel conductive lines on the third barrier layer, the second set of parallel conductive lines substantially in alignment with the patterned columnar stack of layers and substantially perpendicular to the first set of parallel conductive lines.

The first, second, and third barrier layers may independently comprise TiN, TiSix, CoSix, or combinations thereof. The antifuse layer may comprise silicon oxide.

Another embodiment of the invention provides a method for fabricating a memory array. The method comprises forming a first patterned set of parallel conductive lines over a substrate, and forming a plurality of semiconductor pillars on the first patterned set of parallel conductive lines and extending therefrom. Preferably, a pillar comprises a first barrier layer, an antifuse layer, a diode, and a second barrier layer. In preferred embodiments, the electric current flows through the diode upon a breakdown of the antifuse layer. Embodiments of the invention further comprise depositing a dielectric between the plurality of semiconductor pillars, plasma etching a deep via recess through the dielectric and through an underlying layer after the steps of forming a plurality of semiconductor pillars and depositing a dielectric.

In a preferred embodiment of the fabrication method, the substrate comprises a layer of memory cells and a dielectric layer interposed between the layer of memory cells and the first patterned set of parallel conductive lines. The substrate may comprise a silicon layer and a read/write transistor. In preferred embodiments, forming a plurality of semiconductor pillars on the first patterned set of parallel conductive lines further includes substantially aligning a pillar with a conductive line. Preferably, substantially aligning a pillar with a conductive line comprises patterning and etching the pillar.

Other embodiments of the invention provide alternative methods for fabricating a memory array. An embodiment comprises forming a first patterned set of parallel conductive lines on an underlying layer, forming a first barrier layer on the first patterned set of parallel conductive lines, and forming a doped polysilicon layer on the first barrier layer. Preferred embodiments may also comprise forming an antifuse layer on the doped polysilicon layer, forming a second barrier layer on the antifuse layer, and forming a patterned columnar stack of layers having one end in contact with the first patterned set of parallel conductive lines. Preferably, the patterned columnar stack of layers comprises the second barrier layer, the antifuse layer, the doped polysilicon layer, and the first barrier layer. Embodiments may further comprise depositing a dielectric in a recess between the patterned columnar stack of layers, and plasma etching a deep via recess through the dielectric and through the underlying layer after the steps of forming a patterned columnar stack of layers and depositing a dielectric.

Alternative embodiments further comprise filling the deep via recess with an interlevel conductor, forming a planarized structure by planarizing the interlevel conductor, the first dielectric, and the patterned columnar stack of layers, and forming a third barrier layer on the planarized structure. Embodiments may further comprise forming a second patterned set of parallel conductive lines on the third barrier layer, the second set of parallel conductive lines substantially in alignment with the patterned columnar stack of layers and substantially perpendicular to the first set of parallel conductive lines.

Additional features and advantages of embodiments of the invention will be described hereinafter, which form the subject of the claims of the invention. It should be appreciated by those skilled in the art that the specific embodiments disclosed might be readily utilized as a basis for modifying or designing other structures or processes for carrying out the purposes of the present invention. It should also be realized by those skilled in the art that such equivalent constructions and variations on the example embodiments described do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Figure 1:
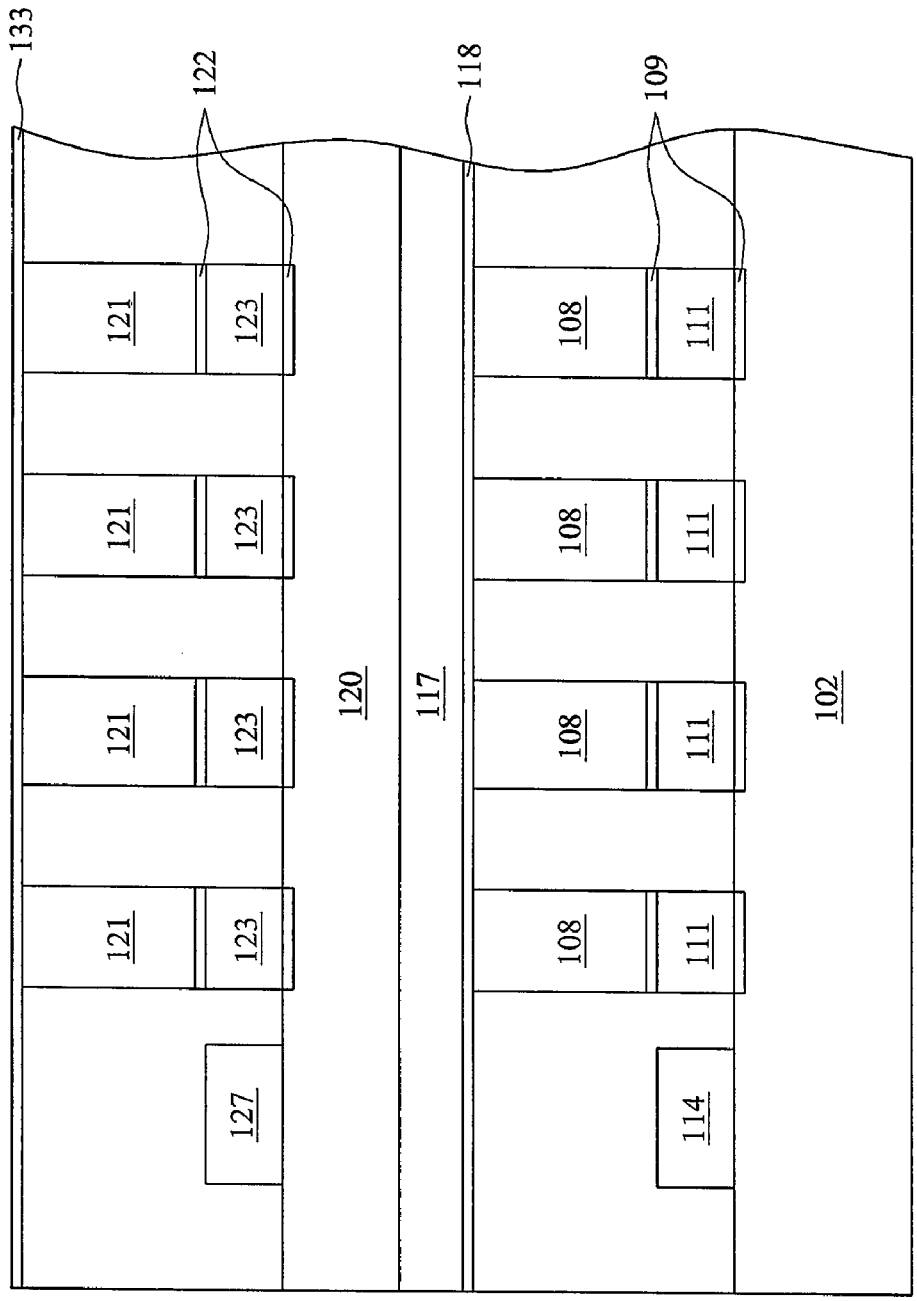
FIGS. 1 and 2 are cross sectional views of an intermediate semiconductor device according to a conventional process.

Corresponding numerals and symbols in the different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The operation and fabrication of the presently preferred embodiments are discussed in detail below. However, the embodiments and examples described herein are not the only applications or uses contemplated for the invention. The specific embodiments discussed are merely illustrative of specific ways to make and use the invention, and do not limit the scope of the invention or the appended claims.

According to embodiments of the present invention, a processing method is presented to avoid or reduce arcing discharge during a reactive ion etching (RIE) process. Although the present invention is explained by exemplary reference to the formation of a particular level of a multi-level (multi-layer) semiconductor device it will be appreciated that the processing method of the present invention may be advantageously applied in general to devices containing dielectric layers to reduce an electrical charge imbalance within portions of the dielectric layers during RIE processing. For example, such devices may include a one time program (OTP) or read only memory (ROM). Embodiments are particularly advantageous in the following plasma processing methods.

In anisotropic etching contact or via holes (openings), plasmas containing fluorocarbons or hydrofluorocarbons including oxygen and nitrogen are typically optimized in various steps in a plasma etch process to selectively etch through the various layers of materials included in a multi-layered semiconductor device. For example, it is typically required to selectively etch through a metal nitride or silicon carbide layer forming the etching stop layer prior to etching the contact or via hole through the IMD layer while minimizing the etching of an overlying patterned photoresist layer. For example, plasmas containing fluorocarbons or hydrofluorocarbons such as CF4 and CHF3 are used to etch through the etching stop layer and more carbon rich hydrofluorocarbons such as C4F6 are used to etch through the etching stop layer and the inter-metal dielectric (IMD) layer. Using carbon-rich hydrofluorocarbons containing plasmas provides a means of selectively etching high aspect ratio contact and via holes through oxide layers such as an IMD layer while minimizing etching of the overlying hard mask or etching stop layer.

Other plasma processes common in semiconductor manufacturing are plasma assisted chemical vapor deposition (CVD) assisted techniques, including PECVD and HDP-CVD. In particular, high density plasma (HDP) processes, such as electron cyclotron resonance (ECR) processes and induced coupling plasma (ICP) processes have been found to produce high-quality low dielectric constant (e.g., <3.0) carbon doped silicon oxide. Generally, HDP-CVD provides a high density of low energy ions resulting in higher quality films at lower deposition temperatures, compared to for example, PECVD. HDP-CVD is particularly ideal for forming inter-metal dielectric (IMD) insulating oxide layers because of its superior gap filling capability.

In a preferred embodiment there is described a method of fabricating an array of stacked memory cells, specifically an array of memory cells comprising EPROM polysilicon diode antifuses. In accordance with preferred embodiments, vias are formed by plasma etching at every other memory cell layer according to the invention.

Figure 2:
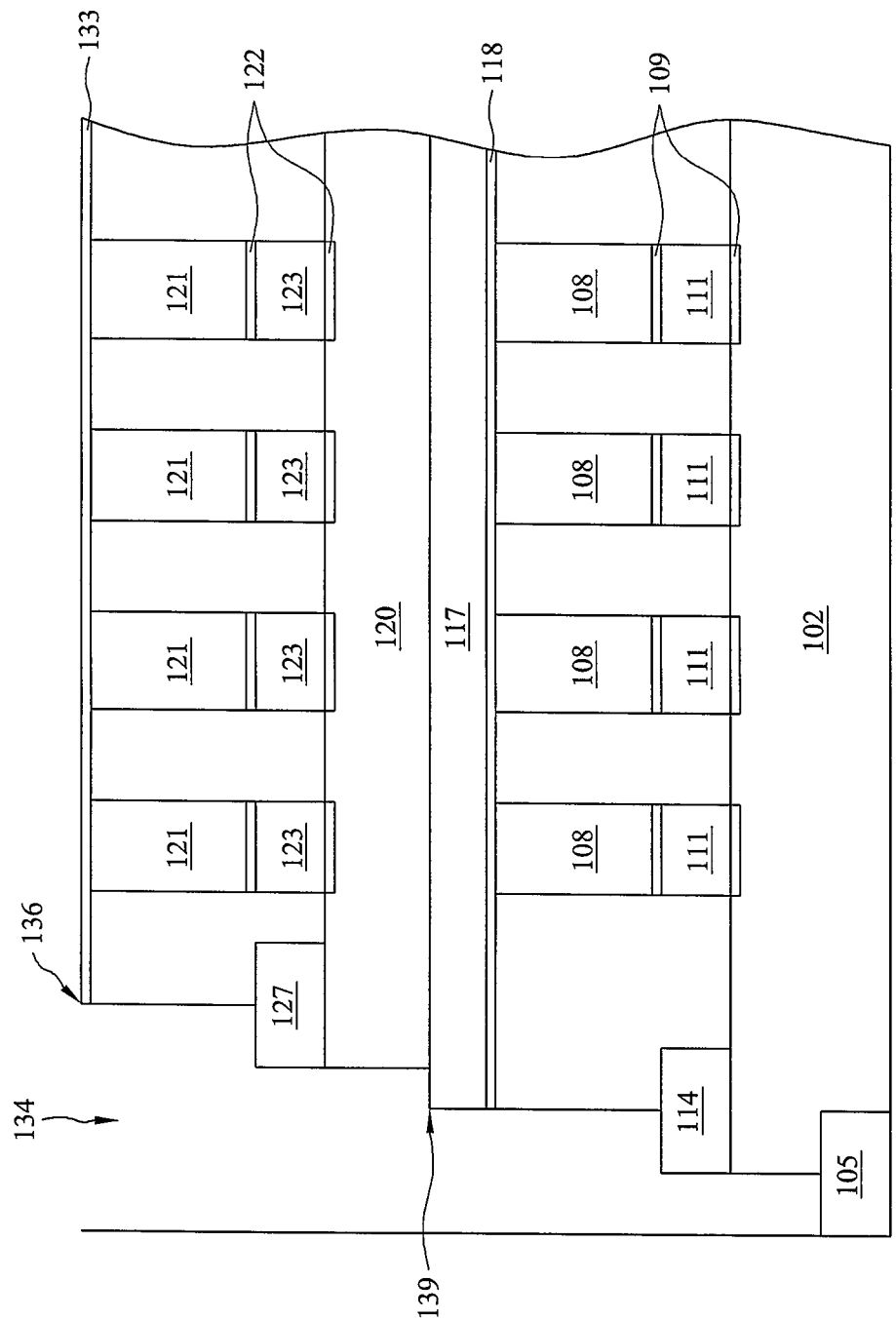
Figure 3:
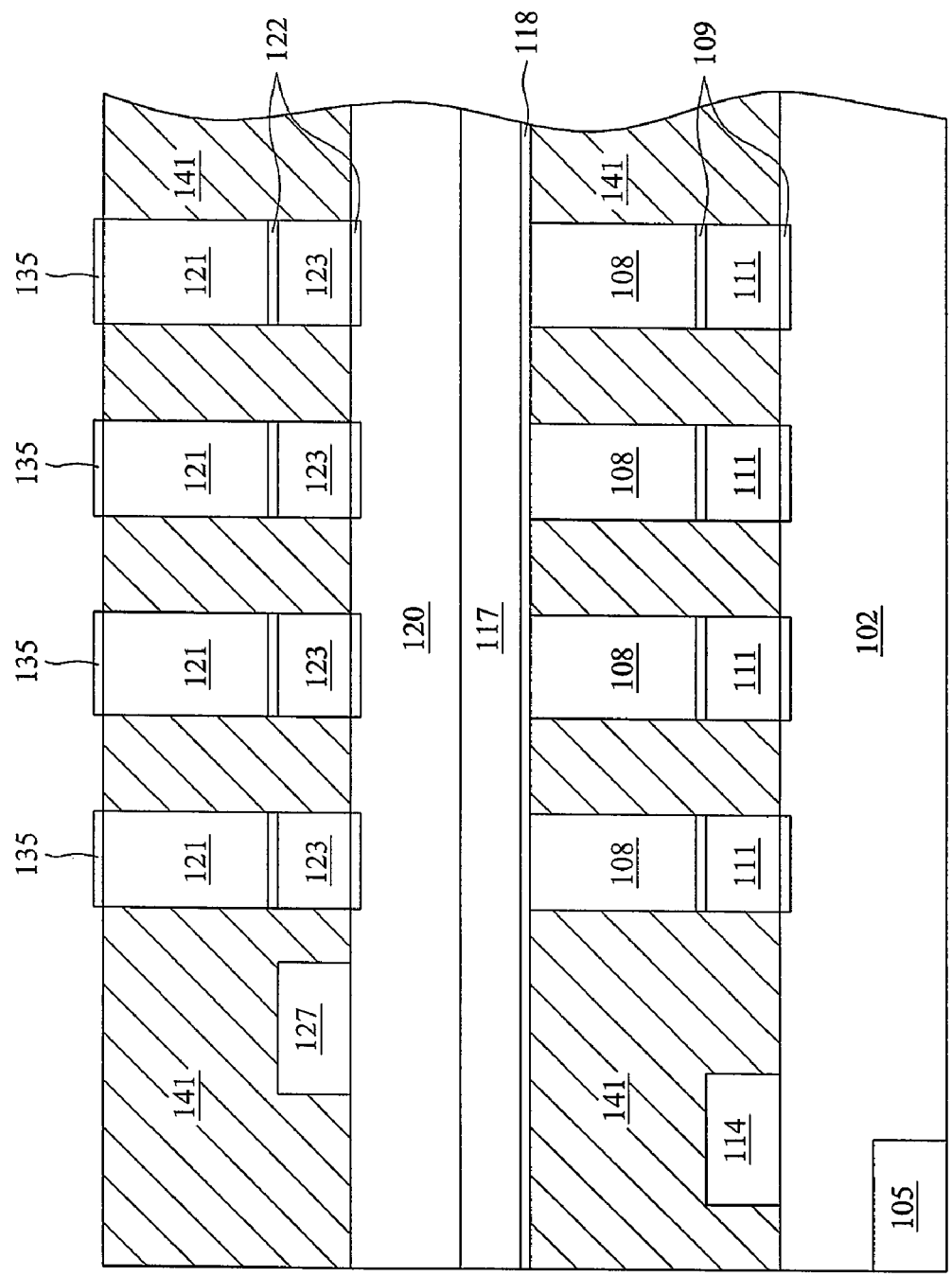
FIG. 3 is a cross sectional view of an intermediate semiconductor device illustrating an embodiment for avoiding plasma arcing.

One embodiment of the invention avoids the arcing problem described with regard to FIG. 2 by photolithographically patterning and etching the structure of FIG. 1 prior to forming the deep via plasma etch. This embodiment is illustrated in FIG. 3. The structure in FIG. 3 may be formed using a conventional patterning and etching process upon the structure in FIG. 1. In this embodiment, an etch process is used to etch down to a conventional inter-diode dielectric 141. As shown in FIG. 3, patterned TiN barrier layers 135 no longer form a layer or plate that may accumulate a charge during plasma processing. However, this process is less preferred because of alignment difficulties in aligning a photolithography mask with the memory cell diodes 121.

In embodiments, the underlying layer 102 may comprise a substrate such as a layer of memory cells and a dielectric layer. In other embodiments, the substrate comprises a silicon layer and a read/write transistor.

Figure 4:
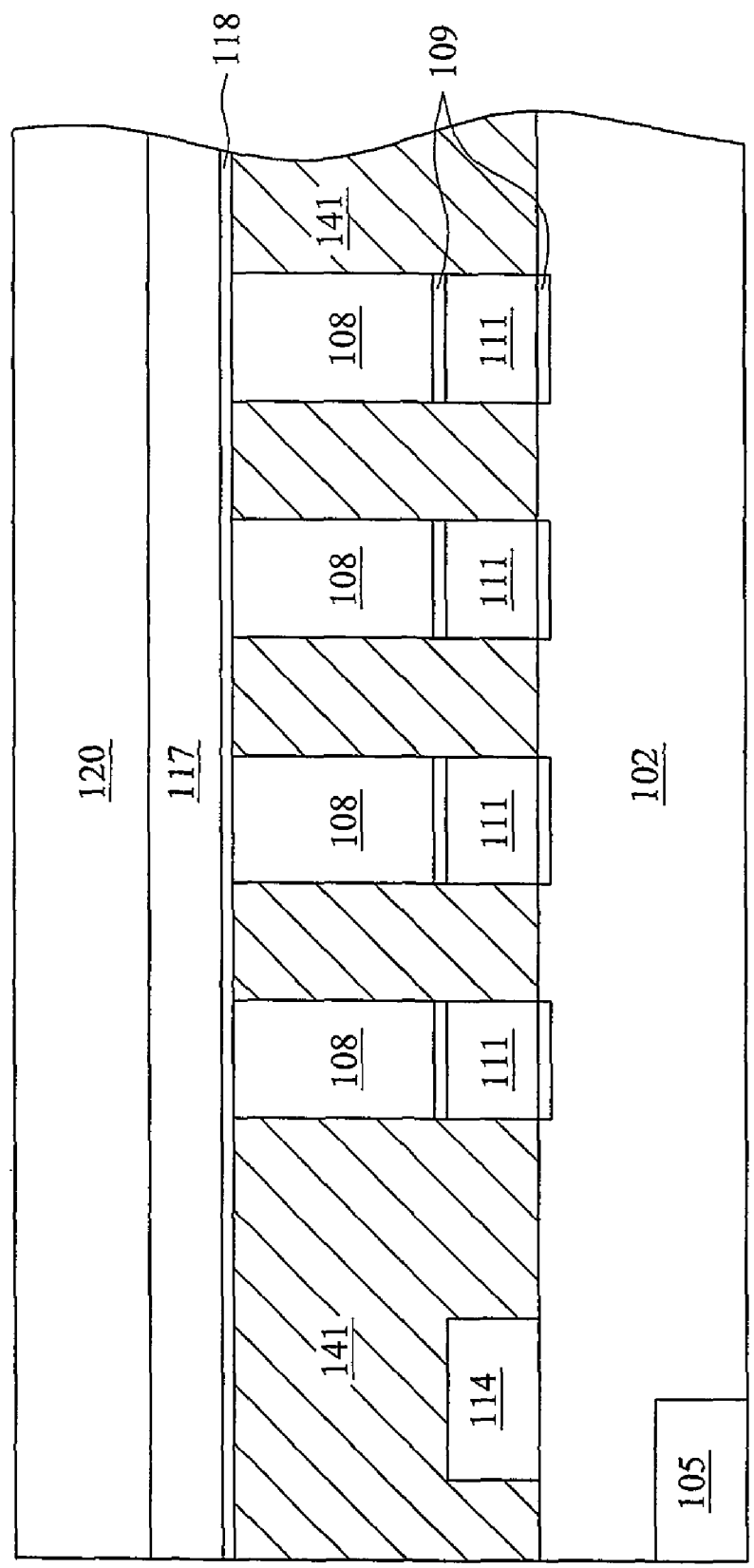
FIG. 4 is a cross sectional view of an intermediate semiconductor device at an early fabrication stage according to preferred embodiments.

In order to avoid plasma arcing, and alignment problems, the preferred embodiment of the invention may begin with the structure illustrated in FIG. 4. The details of conventional antifuse EPROM diode formation are described by S. B. Herner, et al., "Vertical p-i-n Polysilicon Diode With Antifuse for Stackable Field-Programmable ROM," IEEE Electron Device Letters, Vol. 25, No. 5, May 2004, which is hereby incorporated by reference in its entirety. Illustrated in FIG. 4 is a plurality of memory cell antifuse diodes 108 formed in accordance with the conventional processing described by Herner, et al. as well as other conventional processing described above. For clarity, details of memory cell diodes 108 such as an antifuse layer or p-i-n layers are not illustrated.

Embodiments comprising the preferred process may begin with the conventionally formed structure of an EPROM memory cell array of FIG. 4 at an intermediate stage of fabrication. Capping the structure of FIG. 4 is a suitable dielectric layer 120 such as PECVD or HDPCVD SiO2.

In one embodiment, the dielectric insulating layer is formed of any silicon oxide containing material including, for example, silicon dioxide, carbon doped oxide (C-oxide), organo-silicate glass (OSG), undoped silicate glass (USG), and fluorinated silicate glass (FSG). In another embodiment, the dielectric insulating layer is a carbon-doped oxide formed by a plasma assisted CVD process, for example PECVD or HDP-CVD, using organosilane precursors. Organosilane precursors include Si—O groups and Si—Rx groups, where R is an alkyl or cyclo-alkyl group and x the number of R groups bonded to Si. For example, the R group is a methyl (CH3) group. For example, precursors including tetra-methyl-silane (4MS), tri-methyl-silane (3MS), and other organosilane precursors adaptable to CVD deposition are suitably used.

Figure 5:
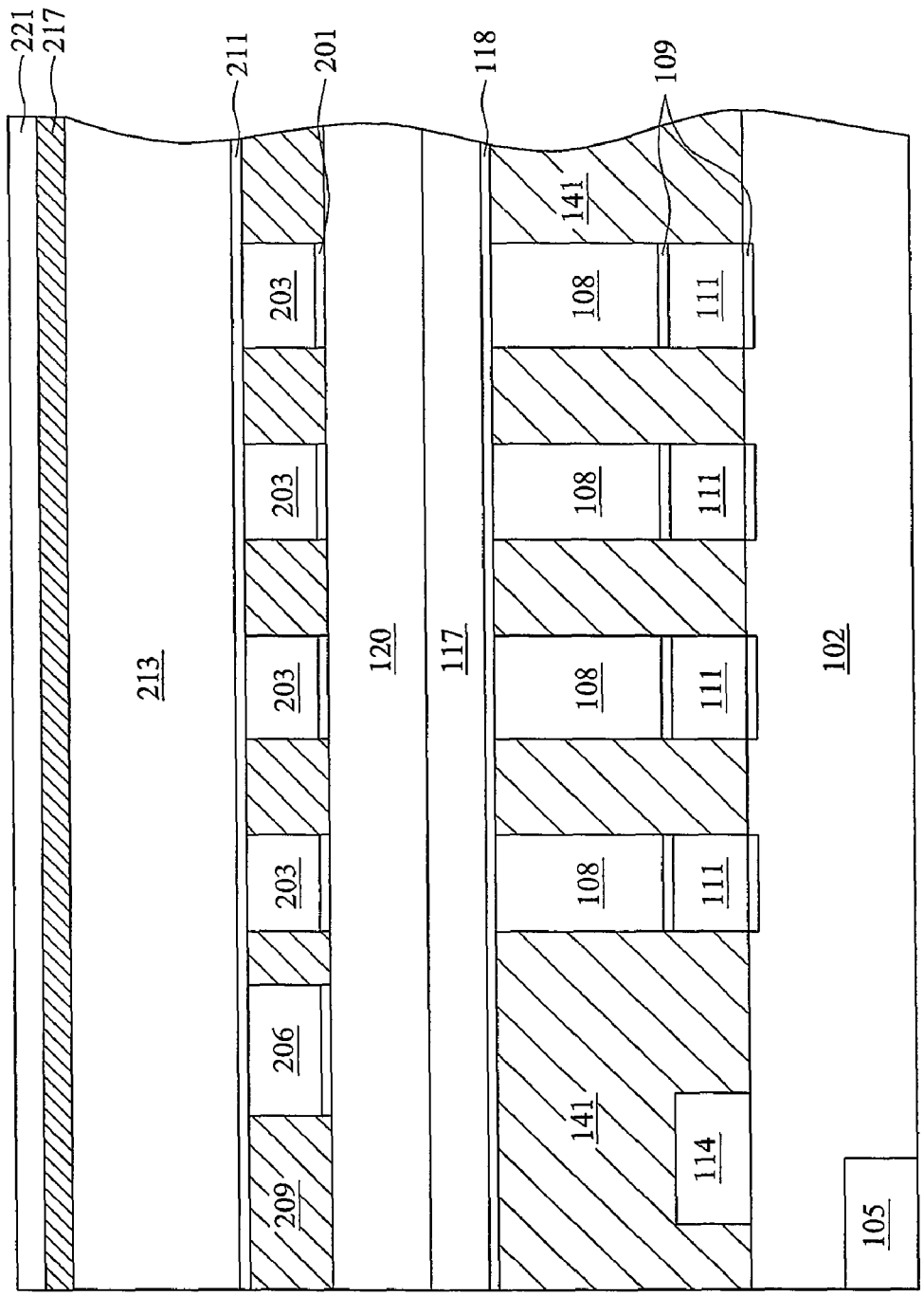
FIG. 5 is a cross sectional view of the device of FIG. 4 further illustrating an barrier layer, an antifuse layer, and a polysilicon diode layer.

Turning now to FIG. 5, there is shown the intermediate device of FIG. 4 after further processing according to preferred embodiments. Formed on dielectric layer 120 is an approximately 200 Å TiN barrier layer upon which is formed an approximately 1500 Å thick tungsten layer. The TiN and W layers are together patterned and etched, thereby forming the plurality of W wiring bitlines 203 and with their respective barrier layers 201 along with a conductor interconnect 206. After patterning and etching, gaps are filed with dielectric 209. After the previous steps, an additional 200 Å TiN barrier layer 211 is formed. Upon the barrier layer 211 there is formed a deposited Si layer 213, about 4300 Å thick (200N+/4100 un-doped), which is suitably doped in-situ for forming a p-i-n diode according to conventional processing. Thereafter is formed an approximately 20 Å SiO2 antifuse layer 217, upon which is formed an approximately 400 Å thick TiN barrier layer 221, thereby completing the intermediate structure illustrated in FIG. 5.

In accordance with preferred embodiments, the TiN barrier layer 221 is thicker than barrier layers 211, 201, 118, and 109, because barrier layer 221 serves as an etch stop layer in addition to a barrier layer.

Figure 6:
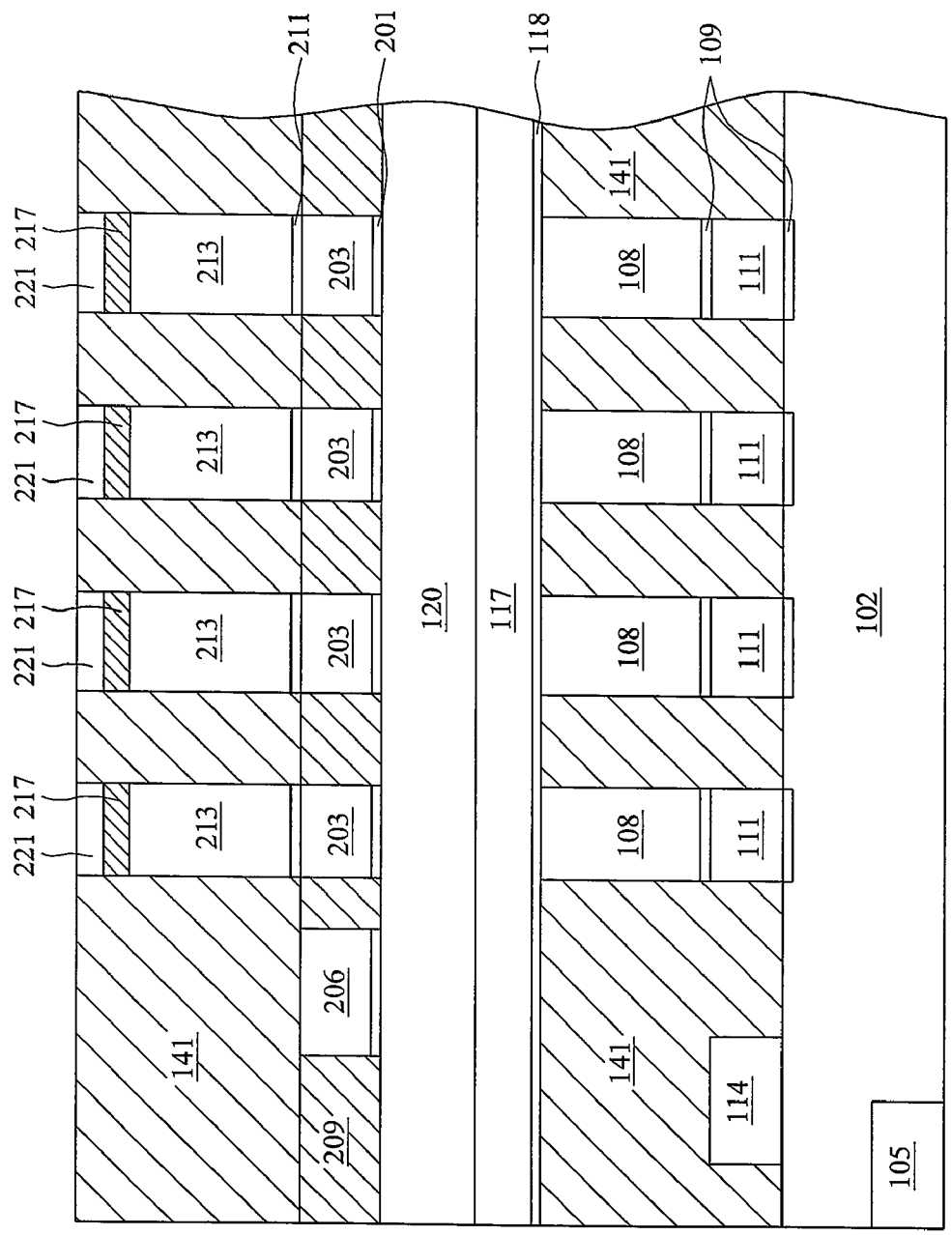
FIG. 6 is a cross sectional view further illustrating patterning and etching of the device of FIG. 5 according to preferred embodiments.

In preparation for formation of a deep via in accordance with preferred embodiments, the structure of FIG. 5 is patterned and etched, resulting in the structure illustrated in FIG. 6. After patterning and etching, there is formed a plurality of memory cell diodes comprising the antifuse 217, upon which is the TiN barrier layer 221. Also, shown in FIG. 6 is a suitable dielectric 141. The dielectric 141 and the TiN barrier layer 221 are planarized, thereby resulting in the structure illustrated in FIG. 6.

Figure 7:
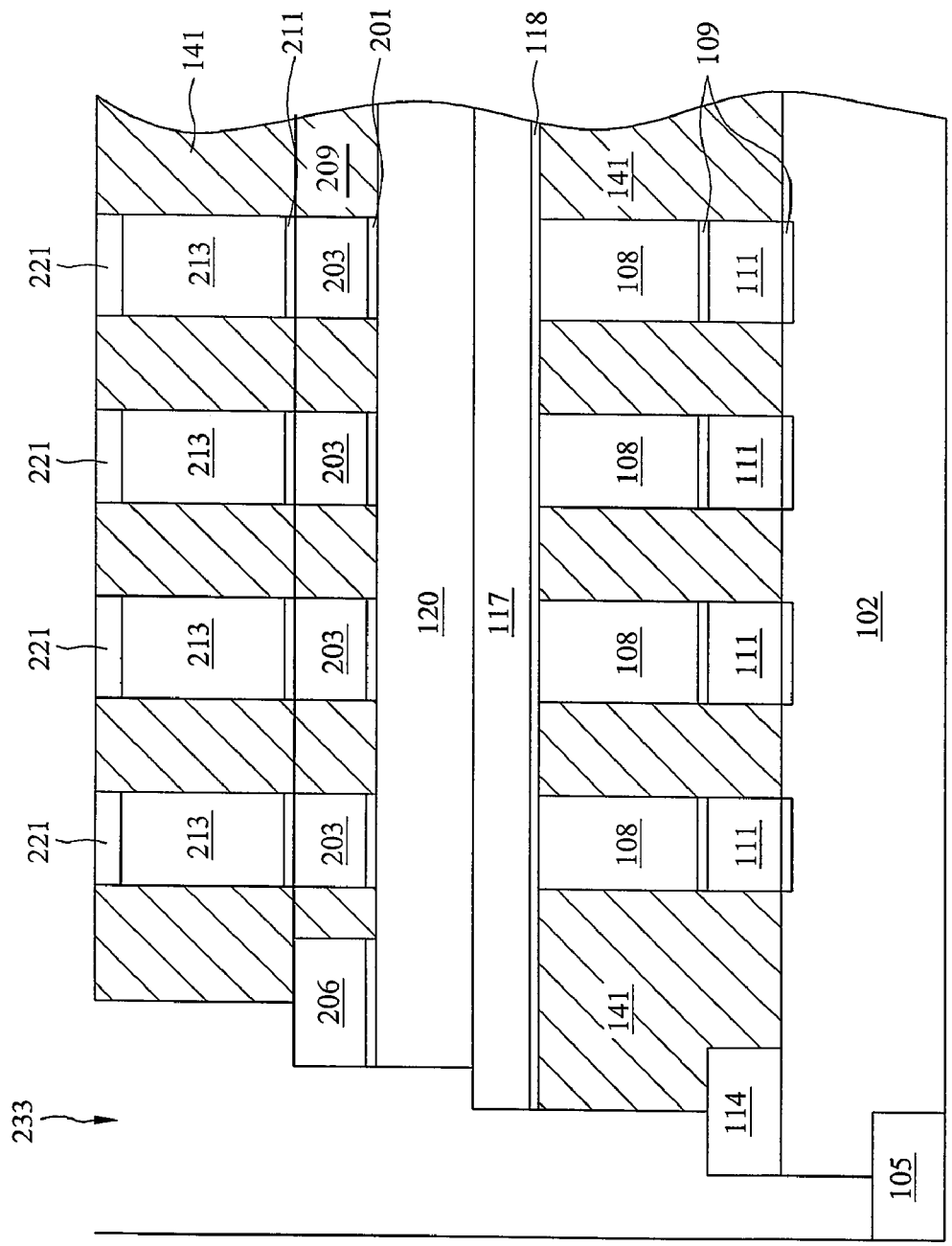
FIG. 7 is a cross sectional view further illustrating deep via formation in the device of FIG. 6 according to preferred embodiments wherein plasma arcing is avoided.

FIG. 7 shows the structure of FIG. 6 after plasma etching to form a deep via 233. Deep via 233 is formed using a reactive ion etching process to anisotropically etch openings after first performing a conventional photolithographic patterning process. For clarity, the antifuse layer 217 is not shown in FIG. 7. Comparison of the preferred embodiment of FIG. 7 with the conventional structure of FIG. 2 makes clear the advantage of the embodiment.

As shown in FIG. 2, TiN barrier layer 133 forms the top plate of a capacitor, which accumulates charge during plasma processing. As described above, this may lead to discharge and destruction of the device. In the preferred embodiment of FIG. 7, however, TiN barrier layer 221 does not form the top plate of a capacitor, thereby advantageously avoiding catastrophic discharge during plasma processing.

Figure 8:
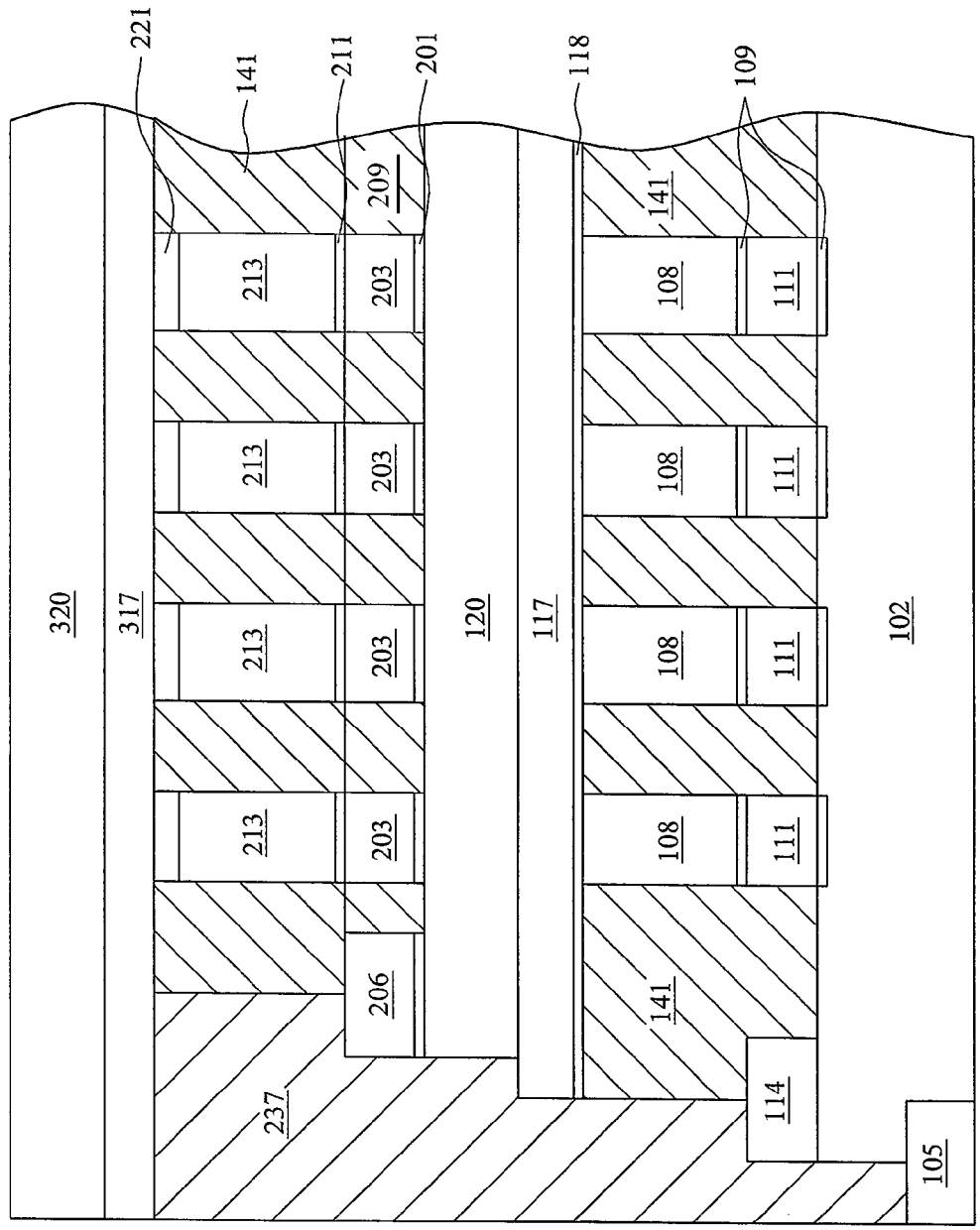
FIG. 8 is a cross sectional view of an embodiment illustrating further processing of the device in FIG. 7.

Further processing completes the second memory array level. First, the deep via 233 is filled with an interlevel conductor 237, as shown in FIG. 8. Continuing with FIG. 8, a conductive layer 317 is formed on TiN barrier layer 221 and the dielectric 141. An interlevel memory array dielectric 320 is formed on conductive layer 317. Although not shown in FIG. 8, layers 317 and 320 may be conventionally patterned whereby conductive layer 317 forms a plurality of parallel wordlines, preferably orthogonal to bitlines 203.

Additional memory array layers may be formed. First, a third array layer, analogous to the first array layer, is formed on the second array layer. Next, a fourth array layer is preferably fabricated in accordance with deep via etching embodiments, as the second memory array layer is formed. The fourth array layer, being formed according to preferred embodiments, is suitable for deep via etching while avoiding plasma arcing. Accordingly, a deep via may be plasma etched through the fourth and third array layers down to the second array level. Embodiments of the invention include repeating the process for as many layers as desired.

In the embodiment described above, deep via etching occurred at every other memory array layer. In alternative embodiments, the arcing resistant features of embodiments may be employed at every layer, every third layer, or every fourth layer as is suitable for the application. The additional stacked memory cells may be formed by repeating the above methods. Briefly, at any memory level where a via etch is required, the TiN barrier is preferably formed according to embodiments of the invention. In other cases, layers are formed conventionally.

As provided above other embodiments may comprise filling the deep via recess with an interlevel conductor and planarizing the structure by planarizing the interlevel conductor, the first dielectric, and the patterned columnar stack of layers. Embodiments may include forming a third barrier layer on the planarized structure, and forming a second patterned set of parallel conductive lines on the third barrier layer, the second set of parallel conductive lines substantially in alignment with the patterned columnar stack of layers and substantially perpendicular to the first set of parallel conductive lines.

Yet still other embodiments of the invention include a memory array formed using embodiments provided herein. The memory array comprises a first patterned set of parallel conductive lines over a substrate. Preferably, the substrate comprises a layer of memory cells and a dielectric layer interposed between the layer of memory cells and the first patterned set of parallel conductive lines. In other embodiments, the substrate comprises a silicon layer and a read/write transistor. In embodiments, the memory array further comprises a plurality of semiconductor pillars on the first patterned set of parallel conductive lines and extending therefrom. Preferably, a pillar comprises a first barrier layer, an antifuse layer, a diode, and a second barrier layer, wherein an electric current flows through the diode upon a breakdown of the antifuse layer. Preferably, the antifuse layer comprises silicon oxide. Embodiments further include a dielectric between the plurality of semiconductor pillars, and a deep via recess through the dielectric and through an underlying layer. Preferably, the first patterned set of conductive lines comprise tungsten, and the barrier layer and the second barrier layer comprise titanium nitride (TiN).

In embodiments of the invention, conductive lines may include W, WSix, Cu, or a metal having a melting point greater than about 700° C. Barrier layers may comprise TiN, TiSix, or CoSix.

The embodiments of the invention described above are exemplary and not limiting, and variations that are apparent to those skilled in the art that include the features of the invention are within the scope of the invention and the appended claims. Although embodiments of the present invention and their advantages have been described in detail, it should be understood that various changes, substitutions and alterations can be made herein without departing from the spirit and scope of the invention as defined by the appended claims.

For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for fabricating a memory array comprising:
forming a first patterned set of parallel conductive lines over a substrate;
forming a plurality of semiconductor pillars on the first patterned set of parallel conductive lines and extending therefrom, wherein each of the semiconductor pillars comprises a first barrier layer, an antifuse layer, a diode, and a second barrier layer, wherein an electric current flows through the diode upon a breakdown of the antifuse layer;
depositing a dielectric between the plurality of semiconductor pillars; and
plasma etching a deep via recess through the dielectric and through an underlying layer after the steps of forming the plurality of semiconductor pillars and depositing the dielectric, the deep via recess exposing a portion of the dielectric and the deep via recess being isolated from the second barrier layer during the plasma etching by the dielectric.

2. The method of claim 1, wherein the substrate comprises a layer of memory cells and a dielectric layer interposed between the layer of memory cells and the first patterned set of parallel conductive lines.

3. The method of claim 1, wherein the substrate comprises a silicon layer and a read/write transistor.

4. The method of claim 1, wherein forming the plurality of semiconductor pillars on the first patterned set of parallel conductive lines further includes substantially aligning the pillars with a respective one of the parallel conductive lines.

5. The method of claim 4, wherein the substantially aligning the pillar with the conductive line comprises patterning and etching the pillar.

6. The method of claim 1, wherein the first patterned set of parallel conductive lines comprise tungsten.

7. The method of claim 1, wherein the first barrier layer and the second barrier layer comprise titanium nitride (TiN).

8. The method of claim 1, wherein the antifuse layer comprises silicon oxide.

9. A method for fabricating a memory array comprising:
   forming a first patterned set of parallel conductive lines on an underlying layer;
   forming a first barrier layer on the first patterned set of parallel conductive lines;
   forming a doped polysilicon layer on the first barrier layer;
   forming an antifuse layer on the doped polysilicon layer;
   forming a second barrier layer on the antifuse layer;
   forming a patterned columnar stack of layers having one end in contact with the first patterned set of parallel conductive lines, the patterned columnar stack of layers comprising the second barrier layer, the antifuse layer, the doped polysilicon layer, and the first barrier layer;
   depositing a dielectric in a recess between the patterned columnar stack of layers; and
   plasma etching a deep via recess through the dielectric and through the underlying layer after the steps of forming a patterned columnar stack of layers and depositing a dielectric, wherein during the plasma etching the via recess exposes a vertical portion in the dielectric and via recess is isolated from the second barrier layer during the plasma etching by the dielectric.

10. The method of claim 9, wherein the underlying layer comprises a layer of memory cells.

11. The method of claim 9, wherein the underlying layer comprises a substrate and a read/write transistor.

12. The method of claim 9, further comprising:
    filling the deep via recess with an interlevel conductor;
    forming a planarized structure by planarizing the interlevel conductor, the dielectric, and the patterned columnar stack of layers;
    forming a third barrier layer on the planarized structure; and
    forming a second patterned set of parallel conductive lines on the third barrier layer, the second patterned set of parallel conductive lines substantially in alignment with the patterned columnar stack of layers and substantially perpendicular to the first patterned set of parallel conductive lines.

13. The method of claim 12, wherein the first barrier layer, the second barrier layer, and the third barrier comprise a material selected from the group consisting essentially of TiN, TiSix, and CoSix, and combinations thereof.

* * * * *